United States Patent
Lau

(12) 
(10) Patent No.: US 11,101,630 B1
(45) Date of Patent: Aug. 24, 2021

(54) BUSBAR ASSEMBLY FOR IMMERSION COOLING

(71) Applicant: LiquidStack Holding B.V., Amsterdam (NL)

(72) Inventor: Kar-Wing Lau, Hong Kong (CN)

(73) Assignee: LiquidStack Holding B.V., Amsterdam (NL)

( * ) Notice: Subject to any disclaimer, the term of this patent is extended or adjusted under 35 U.S.C. 154(b) by 0 days.

(21) Appl. No.: 17/148,776

(22) Filed: Jan. 14, 2021

(51) Int. Cl.
*H02G 5/10* (2006.01)
*H05K 7/20* (2006.01)

(52) U.S. Cl.
CPC ............ *H02G 5/10* (2013.01); *H05K 7/203* (2013.01); *H05K 7/20318* (2013.01)

(58) Field of Classification Search
CPC .. H05K 7/20927; H05K 7/1432; H05K 7/209; H05K 7/20254; H05K 7/203; H05K 7/20818; H05K 7/20945; H05K 7/20236; H05K 7/20854; H05K 7/20318; H05K 7/20327; H05K 7/20872; H02G 5/10; H02G 3/16; H02G 3/03
See application file for complete search history.

(56) References Cited

U.S. PATENT DOCUMENTS

| | | | | |
|---|---|---|---|---|
| 3,346,776 A | * | 10/1967 | Olashaw | H02B 1/36 361/608 |
| 5,442,135 A | * | 8/1995 | Faulkner | H02G 5/007 174/68.2 |
| 7,704,083 B1 | * | 4/2010 | Cheyne | H01R 25/162 439/115 |
| 10,257,960 B1 | * | 4/2019 | Banerjee | H05K 7/20327 |
| 10,321,603 B1 | * | 6/2019 | Banerjee | H05K 7/20236 |
| 2011/0042387 A1 | * | 2/2011 | Henry | H05B 3/42 220/592.01 |
| 2014/0218858 A1 | * | 8/2014 | Shelnutt | H05K 7/20827 361/679.31 |
| 2015/0333442 A1 | * | 11/2015 | Naganuma | H01R 12/7047 439/121 |
| 2017/0273205 A1 | | 9/2017 | Hanft et al. | |
| 2017/0326489 A1 | * | 11/2017 | Lau | B01D 46/0005 |
| 2020/0060033 A1 | | 2/2020 | Adrian | |
| 2020/0093037 A1 | * | 3/2020 | Enright | H05K 7/20381 |
| 2020/0396865 A1 | * | 12/2020 | Meyer | H01L 23/36 |

* cited by examiner

*Primary Examiner* — Adam B Dravininkas
(74) *Attorney, Agent, or Firm* — Goodwin Procter LLP

(57) ABSTRACT

Embodiments of busbar assemblies for immersion cooling are described herein. In one embodiment, a busbar assembly can include an insulator block and a busbar. The insulator block can include a first barrier extending from a first end of the insulator block to a second end of the insulator block. The insulator block can a second barrier extending from the first end to the second end. The first barrier can include a first support surface. The second barrier can include a second support surface. The insulator block can include a channel between the first barrier and the second barrier. The channel can extend from the first end to the second end. The busbar can be positioned in the channel. The busbar may have a top surface that is recessed below the first support surface and the second support surface. Other examples may be described and claimed.

20 Claims, 7 Drawing Sheets

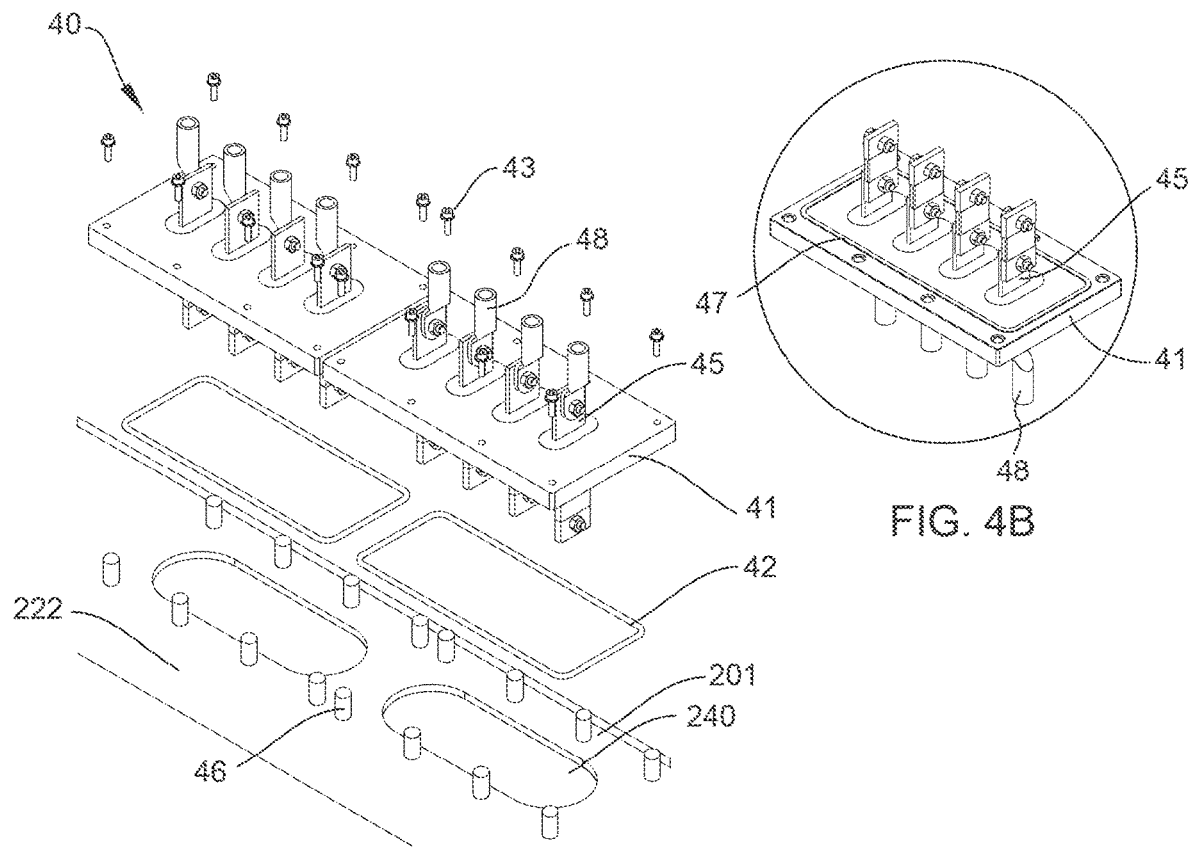
FIG. 4A
FIG. 4B
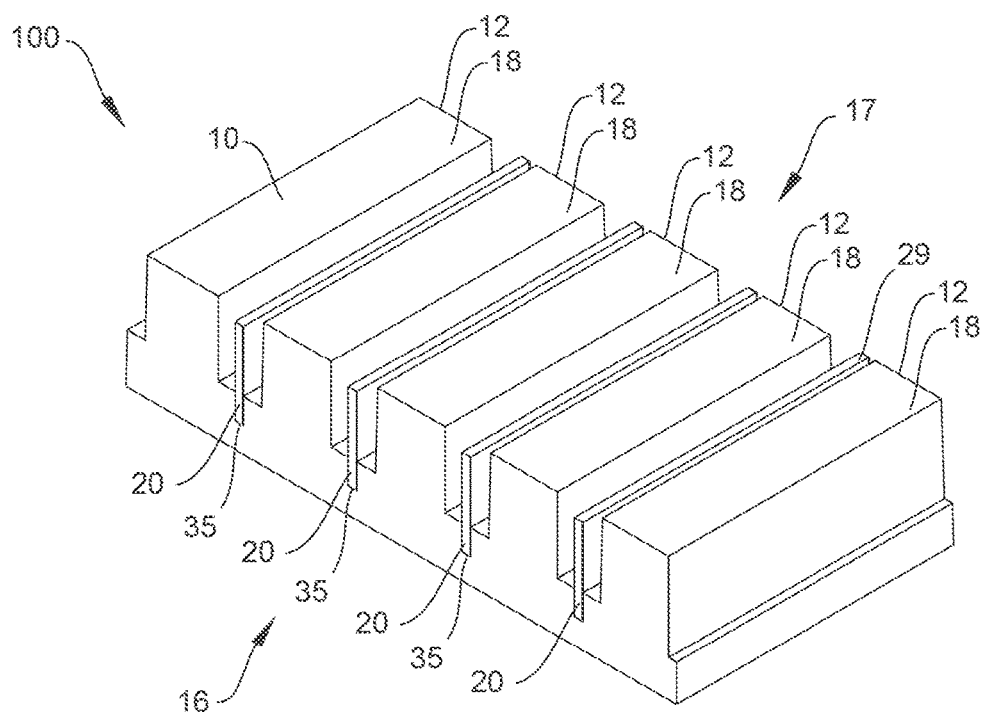
FIG. 5

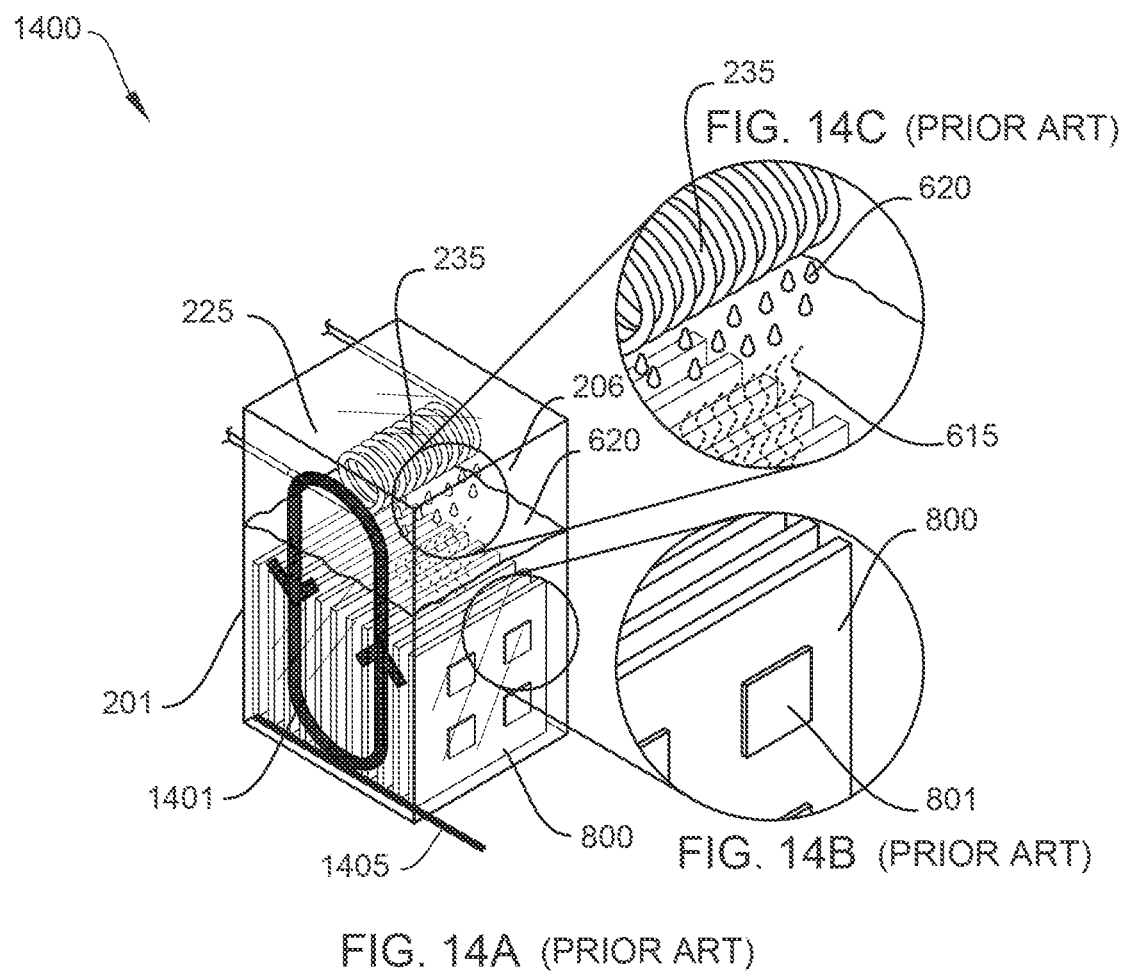
FIG. 14C (PRIOR ART)
FIG. 14B (PRIOR ART)
FIG. 14A (PRIOR ART)
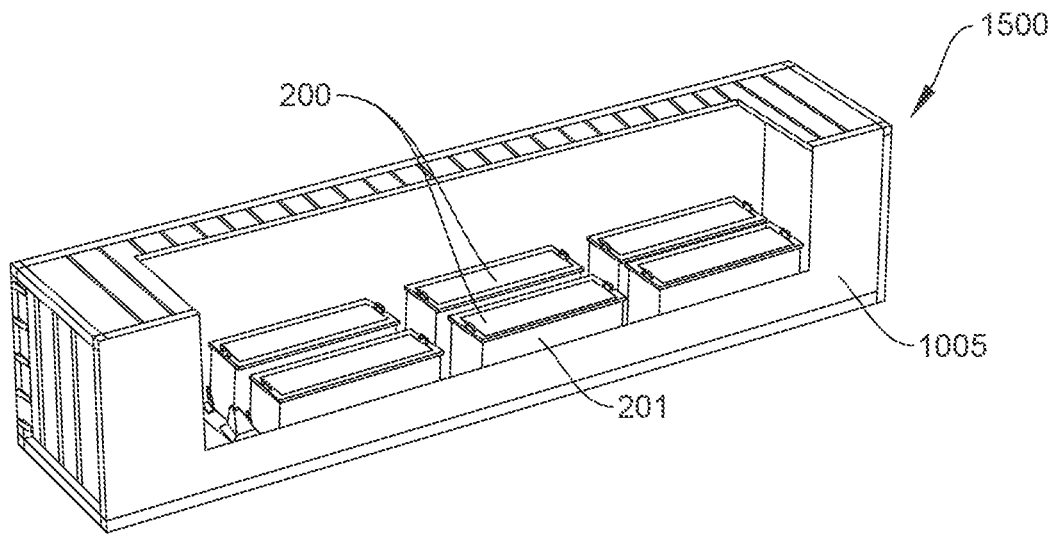
FIG. 15 (PRIOR ART)

BUSBAR ASSEMBLY FOR IMMERSION COOLING

FIELD OF THE INVENTION

This disclosure relates to immersion cooling apparatuses and, more specifically, to busbar assemblies for immersion cooling apparatuses.

BACKGROUND

Data centers house information technology (IT) equipment for the purposes of storing, processing, and disseminating data and applications. IT equipment may include electronic devices, such as servers, storage systems, power distribution units, routers, switches, and firewalls.

IT equipment consumes electricity and produces waste heat as a byproduct. A data center with thousands of operating servers requires a dedicated IT cooling system to manage the waste heat. The waste heat must be captured and rejected from the data center. If the waste heat is not removed, ambient temperature within the data center may rise above an acceptable threshold and temperature-induced performance throttling of electronic devices (e.g. microprocessors) may occur, which is undesirable.

Direct liquid cooling systems can be used to cool IT equipment. One form of direct liquid cooling is immersion cooling. In an immersion cooling system, an electronic device is immersed in dielectric fluid. Waste heat from the electronic device is transferred to the fluid and then captured from the fluid and rejected outside the data center through a suitable heat rejection device.

FIGS. 14A through 14C show a prior art example of a basic two-phase immersion cooling apparatus 1400. The apparatus 1400 includes an immersion tank 201 partially filled with dielectric fluid 620, such as hydrofluoroether, in liquid phase. The apparatus 1400 includes a condenser 235 mounted in a headspace of the immersion tank 201. An electronic device 800 is immersed in the dielectric fluid 620. The electronic device 800 may be a server including one or more microprocessors 801. The immersion tank 201 is enclosed by a lid 225.

During operation, the electronic device 800 produces waste heat. The waste heat is transferred to the dielectric fluid 620, which causes a portion of the dielectric fluid 620 to boil and form a dielectric vapor 615. The dielectric vapor 615 rises through a bath of dielectric liquid 620 and enters the headspace 206 of the immersion tank 201. When the dielectric vapor 615 contacts the condenser 235, it condenses back to dielectric liquid 620 and passively recirculates back to the liquid bath, thereby completing a cycle 1401 of evaporation, condensation, precipitation, and collection.

In two-phase immersion cooling systems, cables or busbars are commonly used to transfer electrical power from an external power source to electronic devices within the immersion cooling tank. Using cables to transfer electrical power, however, has certain disadvantages. First, cables complicate routine maintenance. For example, electronic devices are typically inserted vertically into the immersion tank. Cables are connected to the top side of the electronic device. When removing the electronic device from the immersion tank, the cables must be removed and stowed before the electronic device can be removed. Often, maintenance personnel must insert their hands into hot dielectric liquid to disconnect the cables. The hot dielectric liquid is significantly above body temperature and is uncomfortable even while wearing heat insulating gloves. Second, certain cables may be incompatible with the dielectric fluid in the system. Cables contain insulation that may be made of plastic material. Depending on the type of material, there could be chemical compatibility issues that result in deterioration of the cables and contamination of the fluid.

As a result, instead of using cables, the electronic device(s) 800 may be designed to mate with busbars located at the bottom of the immersion tank. As an example, the electronic device(s) 800 can be equipped with busbar clips designed to engage and electrically connect to the busbars at the bottom of the immersion tank 201. Since busbars normally do not have insulation, there may be no chemical compatibility issue with the dielectric fluid.

The prior art immersion tank 201 shown in FIG. 14A includes a busbar 1405 that penetrates a side wall of the immersion tank 201. The busbar 1405 delivers electrical power to the electronic devices 800 within the immersion tank 201. This configuration may be suitable for certain stationary tanks 201 that experience minimal vibration or movement during use. However, for immersion cooling tanks 201 that are used in mobile data centers 1500 (FIG. 15), this configuration is unacceptable. Mobile data centers 1500, such as the one shown in FIG. 15, may include immersion cooling tanks 201 arranged in a shipping container 1005. The mobile data center 1500 may be shipped over-the-road, for example, on a flatbed trailer. Due to vibrations resulting from transit and installation, fluid leaks may develop where the busbar 1405 penetrates the side wall of the immersion tank 201.

If fluid leaks from the immersion tank 201, the liquid level in the tank 201 will decrease, potentially exposing the electronic device(s) 800 to ambient air. At that time, the system may fail to effectively cool the electronic device(s) 800. The electronic device(s) 800 may overheat and then shut down or experience performance throttling.

Certain prior art busbars, such as the example shown in FIG. 12, have exposed, uninsulated metal bars 20' that present a safety risk to data center staff. A person may inadvertently contact an exposed busbar 20' and be electrocuted. In another example, a person may accidentally drop a metal tool, such as a wrench, into the tank 201 and short-circuit the busbar assembly 100', causing system downtime and damage to electronic hardware 800.

Certain prior art busbar assemblies 100", such as the example shown in FIG. 13, are coated with a cast resin to insulate the busbar 20" and prevent accidental electrocution. The cast resin may create thermal resistance that prevents the dielectric liquid 620 from effectively cooling the busbars 20". Excess heat buildup may increase resistance and decrease transmission efficiency. Also, the cast resin may not be chemically compatible with the dielectric liquid 620 and may degrade over time and contaminate the dielectric liquid 620, requiring fluid filtering or replacement.

Certain prior art busbar assemblies 100", such as the example shown in FIG. 13, may have closely spaced, horizontal busbars 20". During use, the busbars 20" may get hot and need to be cooled. In a two-phase cooling system, vapor bubbles may form on the surfaces of the busbars 20" and float upward in the liquid bath. As the rate of electrical power usage increase, the busbars 20" will produce more waste heat and, in turn, produce more vigorous boiling. At some point, due to the narrow gaps between the horizontally-oriented busbars 20", vapor bubbles will be produced more rapidly than are able to escape from the gaps. A buildup of vapor may occur and the vapor bubbles may act as an insulating layer, resulting in a condition known as dry-out. Dry-out results when vapor is unable to escape from a surface and prevents subcooled fluid from reaching and, thereby, cooling the surface of the electronic device(s) 800. Dry-out can result in increased thermal resistivity and overheating. In extreme cases, dry-out can result in thermal runaway and device failure.

SUMMARY OF THE INVENTION

In a first aspect, the present invention relates to a busbar assembly for an immersion cooling apparatus. In some embodiments, the busbar assembly includes an insulator block having a first end and a second end opposite the first end block, a slot, and a busbar. In some implementations, the insulator block is made of one or more dielectric materials (e.g., a phenolic material, a mylar material, a polyimide material, and an epoxy material) and includes: a first barrier extending from the first end to the second end, the first barrier comprising a first support surface and a first barrier width; a second barrier extending from the first end to the second end, the second barrier comprising a second support surface and a second barrier width; and a channel between the first barrier and the second barrier, the channel extending from the first end to the second end and having a channel width. In some variations, the slot may be formed in a bottom surface of the channel and the busbar may be disposed in the slot. Advantageously, the busbar has a top surface that is recessed below the first support surface and/or the second support surface.

In some implementations, the busbar may be substantially centered in the channel. For example, a first clearance gap may be formed in the channel between the busbar and the first barrier and a second clearance gap may be formed in the channel between the busbar and the second barrier, such that the first clearance gap is greater than the busbar width and the second clearance gap is greater than the busbar width and/or the top surface of the busbar is recessed below at least one of the first support surface and the second support surface a distance that is greater than at least one of the first clearance gap or the second clearance gap.

In some embodiments, the channel is one of a plurality of channels formed in the insulator block and the busbar is one of a plurality of busbars, such that the plurality of channels are arranged in a parallel configuration and each channel contains one of the busbars. In some variations, the busbars are adapted to transmit single-phase power or three-phase electrical power. For example, the busbars may include a first set of busbars configured to transmit three-phase electrical power and a second set of busbars configured to transmit three-phase electrical power, such that the first set of busbars and the second set of busbars are arranged in a symmetrical configuration to allow an electrical device to be electrically connected to the busbars in at least one of a first orientation or a second orientation.

In a second aspect, the present invention relates to an immersion cooling apparatus. In some embodiments, the immersion cooling apparatus includes an immersion tank, having an upper portion and a lower portion and defining a target liquid level therebetween and comprising an interior volume defined by a bottom portion and a plurality of side walls, and a busbar assembly positioned within the interior volume of the immersion tank. In some applications, the busbar assembly may include: an insulator block having a base portion and an upright portion, such that the base portion is adjacent to an interior surface of the bottom portion and the upright portion is adjacent to an interior surface a side wall of the plurality of side walls; a base channel extending from a first end of the base portion to a second end of the base portion; an upright channel extending from a first end of the upright portion to a second end of the upright portion; a first barrier extending along the base channel and having a first support surface and a first barrier width; a second barrier extending along the base channel and having a second support surface and a second barrier width; and a busbar having a base section electrically connected to an upright section, such that the base section is disposed in the base channel and the upright section is disposed in the upright channel. In some variations, a top surface of the base section is positionable below at least one of the first support surface or the second support surface.

In some applications, the immersion cooling apparatus further includes a condenser located within the interior volume of the immersion tank and above the target liquid level and/or a pass-through connection assembly. In some embodiments, the pass-through connection assembly may include: a connection block mountable to an external surface of the immersion tank above the target liquid level; an electrical connector extending through the connection block; and a seal configured to provide a fluid-tight seal between a bottom surface of the connection block and an outer surface of the immersion tank. In some implementations, the upright section of the busbar is adapted to pass through an opening in the immersion tank and to electrically connect to the electrical connector.

In another implementation, the base channel and the upright channel may form an L-shaped channel and the base section and the upright section form an L-shaped busbar, such that the L-shaped busbar is disposable within the L-shaped channel.

In yet another implementation, the immersion cooling apparatus may also include one or more of: a base slot formed in the base channel, and the base section of the busbar is positionable in the base slot and an upright slot formed in the base channel, such that the upright section of the busbar is positionable in the base slot.

In a third aspect, the present invention relates to a busbar assembly kit for an immersion cooling tank. In some embodiments, the busbar assembly kit includes an insulator block and an L-shaped busbar. In some variations, the L-shaped busbar may include a base section and an upright section and the insulator block may include a base portion and an upright portion that are adapted to form an L-shaped insulator block; a base channel extending from a first end of the base portion to a second end of the base portion; an upright channel extending from a first end of the upright portion to a second end of the upright portion, such that the upright channel and the base channel together form an L-shaped channel; a first barrier having a first support surface and extending along the base channel; and a second barrier having a second support surface and extending along the base channel. Advantageously, the base channel may be configured to receive the base section and the upright channel is configured to receive the upright section and the base section may be recessed below the first support surface and/or the second support surface when the base section is disposed in the base channel.

In some applications, the busbar assembly kit may also include a pass-through connection assembly. In some implementations, the pass-through connection assembly may include: a connection block; an electrical connector extending through the connection block and configured to connect to the upright section of the L-shaped busbar; and a seal configured to provide a fluid-tight seal between a bottom surface of the connection block and an outer surface of an immersion tank. In some variations a groove may be formed in the bottom surface of the connection block and the seal may be disposed in the groove.

In another application, the busbar assembly kit may include one or more of: a base slot in the base channel, such that the base slot is configured to receive the base section of the L-shaped busbar; an upright slot in the upright channel, such that the upright slot is configured to receive the upright section of the L-shaped busbar; and/or a plate connector that is structured and arranged to join the base section of the L-shaped busbar to the upright section of the L-shaped busbar.

In yet another application, the insulator block may also include a third barrier extending along the upright channel and having a third support surface and a fourth barrier extending along the upright channel and having a fourth support surface, such that the upright section is recessed below the third support surface and the fourth support surface when the upright section is installed in the upright channel.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4A shows an exploded view of a pass-through connection assembly and mounting surface of an immersion tank, in accordance with some embodiments of the present invention.

FIG. 4B shows a bottom view of the electrical connection block of the connection assembly of FIG. 4A, in accordance with some embodiments of the present invention.

FIG. 5 shows a side perspective view of a base portion of an exemplary busbar assembly, in accordance with some embodiments of the present invention.

FIGS. 14A through 14C show an exemplary immersion cooling system with a condenser, in accordance with the prior art.

FIG. 15 shows a partial cutaway view of a modular data center exposing a plurality of immersion cooling tank assemblies within a shipping container, in accordance with the prior art.

DETAILED DESCRIPTION

Two-phase immersion cooling systems employ phase change heat transfer, which enables them to cool electronic devices that produce high heat flux densities, such as high-performance computing servers containing one or more central processing units (CPUs) and graphics processing units (GPUs).

Figure 6:
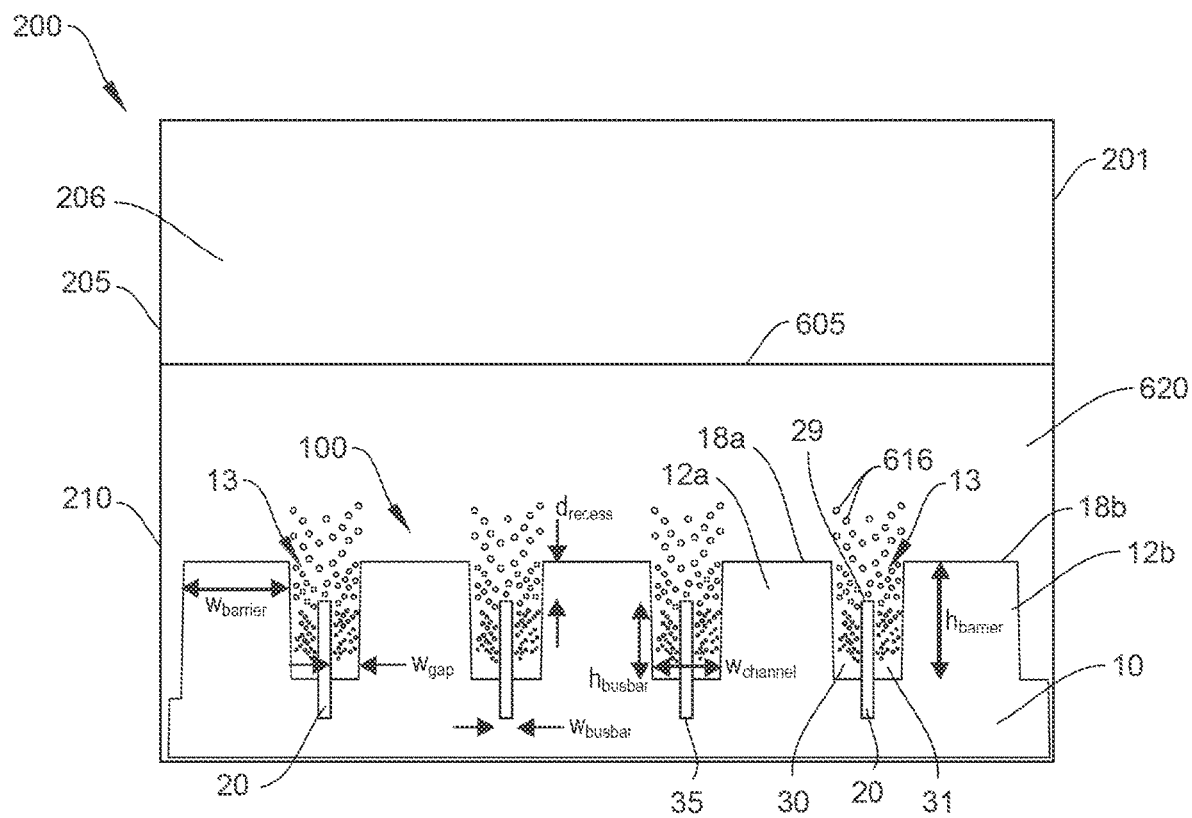
FIG. 6 shows a side cross-sectional view of an immersion cooling tank assembly and the base portion of an exemplary busbar assembly immersed in dielectric fluid, in accordance with some embodiments of the present invention.

To avoid risk of fluid leakage from an immersion tank 201, in some embodiments, a busbar assembly 100 may penetrate the immersion tank 201 above a liquid level 206, as shown in FIG. 6. The liquid level 206 may be defined as an interface between dielectric fluid 620 in liquid phase in the lower portion 210 of the immersion tank 201 and gases (e.g. air, water vapor, and/or dielectric vapor) in the headspace 206 of the immersion tank 201. The busbar assembly 100 may include features that make it safe and convenient for use in immersion cooling systems 200.

Figures 3A, 3B:
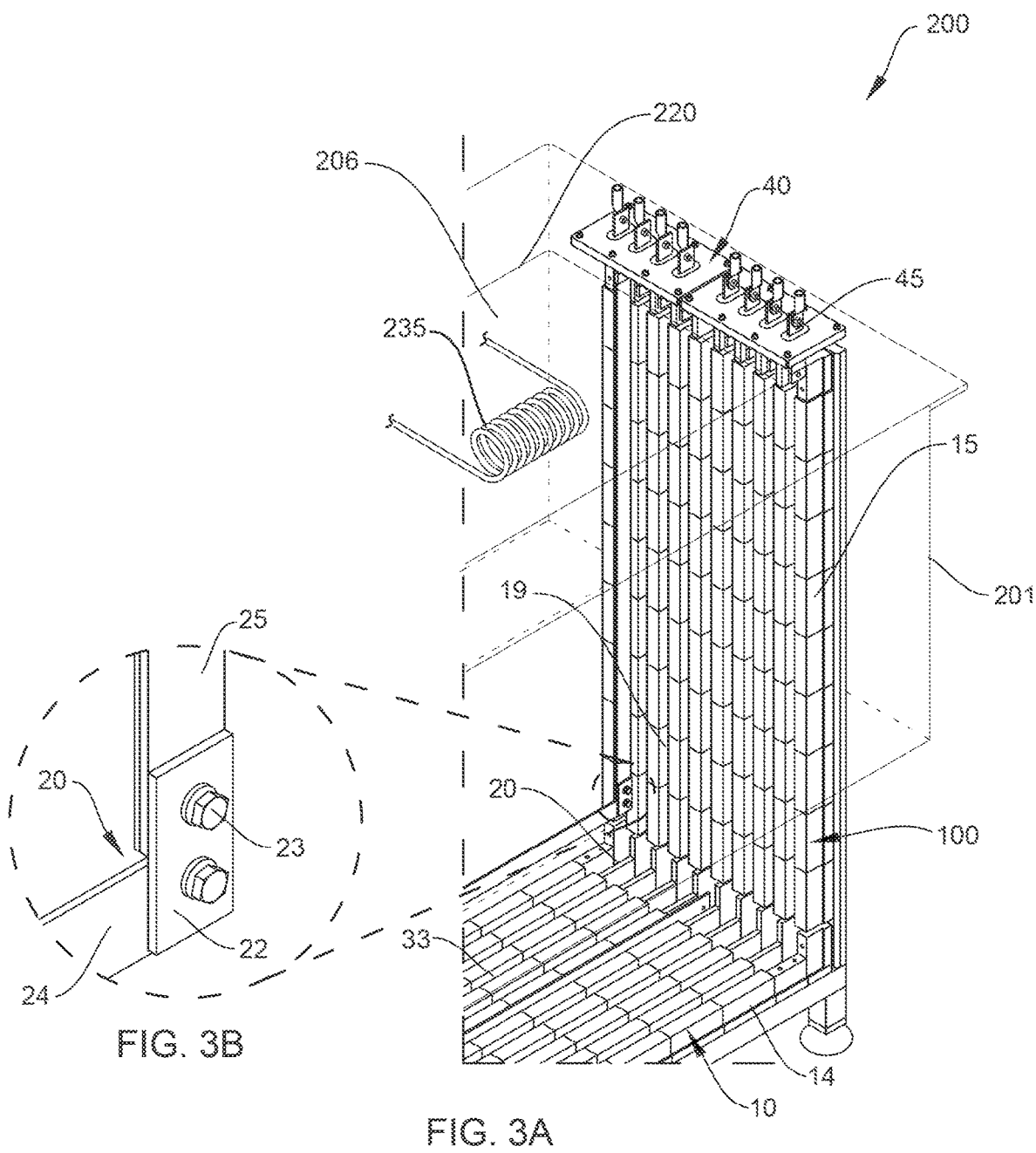
FIG. 3A shows an exemplary busbar assembly disposed in a partial cutaway view of an immersion cooling tank assembly, in accordance with some embodiments of the present invention.
FIG. 3B shows a detail of an exemplary connection between a base portion and an upright portion of the busbar assembly shown in FIG. 3A, in accordance with some embodiments of the present invention.
Figure 12:
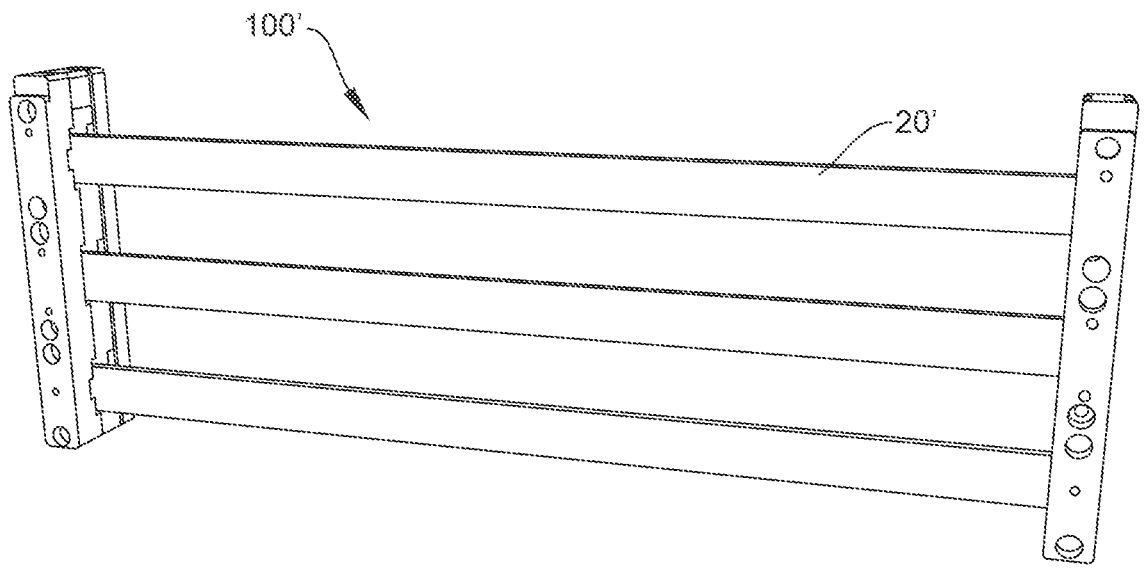
FIG. 12 shows an exemplary busbar assembly, in accordance with the prior art.
Figure 13:
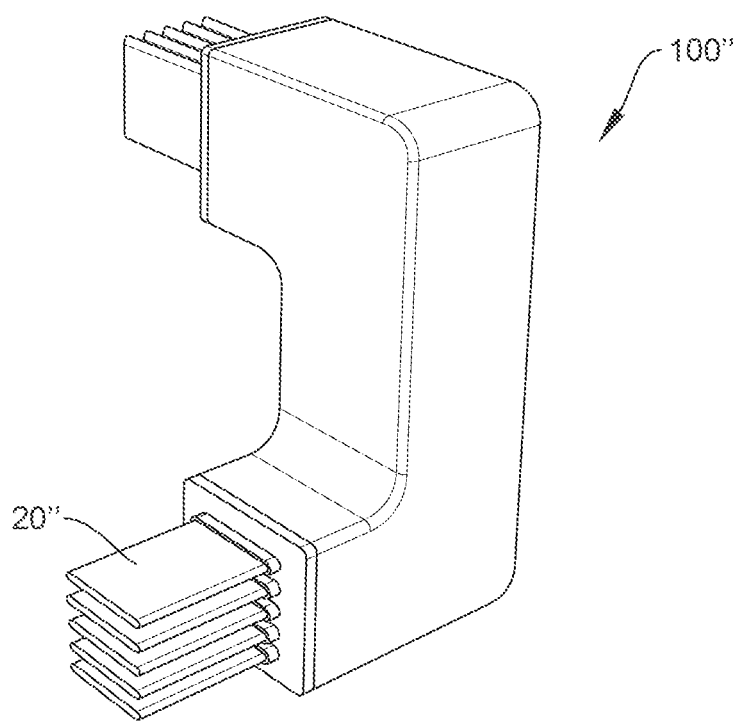
FIG. 13 shows an exemplary horizontally-oriented busbar assembly, in accordance with the prior art.

Unlike the prior art busbar assemblies shown in FIGS. 12 and 13, the busbar assembly 100 shown in FIG. 3A is safe and effective for a wide variety of immersion cooling applications, including data center and transportation applications. Data center applications may include, for example, traditional data centers, mobile data centers 1500 (FIG. 15), or edge data centers. Transportation applications may include, for example, autonomous vehicles that require substantial computing power.

The busbar assembly 100 may safely conceal one or more current carrying busbars 20 to prevent accidental short-circuiting or electrocution. The busbar assembly 100 may be suitable for single-phase immersion cooling or two-phase immersion cooling.

To enable two-phase immersion cooling without risk of dry-out, in some embodiments, the busbar assembly 100 may include channels 13 with ample gaps 30, 31 on each side of the busbars 20, as shown in FIG. 6. The busbars 20 may be arranged vertically and spaced apart. Each busbar 20 may have a suitably sized clearance gap 30, 31 on each side to promote vapor escape. The gaps 30, 31 may have substantially vertical side walls without undercuts or other vapor trapping features. The gaps 30, 31 may allow vapor bubbles 616 to freely escape from the busbar surface 24 and rise in the fluid bath uninhibited. As the vapor bubbles 616 exit the channels 13, subcooled fluid 620 may rush into the gaps 30, 31 and occupy the space vacated by the exiting vapor bubbles 616, producing a continuous supply of subcooled fluid 620 to the busbar surface 24. This configuration may avoid trapping vapor that could act as an insulating layer and produce a critical heat flux condition. The busbar assembly 100 thereby alleviates cooling limitations of certain prior art busbar assemblies by delaying the onset of dry-out on the busbar surface.

A two-phase immersion cooling apparatus 200 may include an immersion tank 201, as shown in FIG. 3A. The immersion tank 201 may have an upper portion 205 and a lower portion 210 (FIG. 6). The upper portion 205 may be a portion of the immersion tank 201 located above a liquid level 206. The lower portion 210 may be a portion of the immersion tank 201 located below the liquid level 206.

Figure 1:
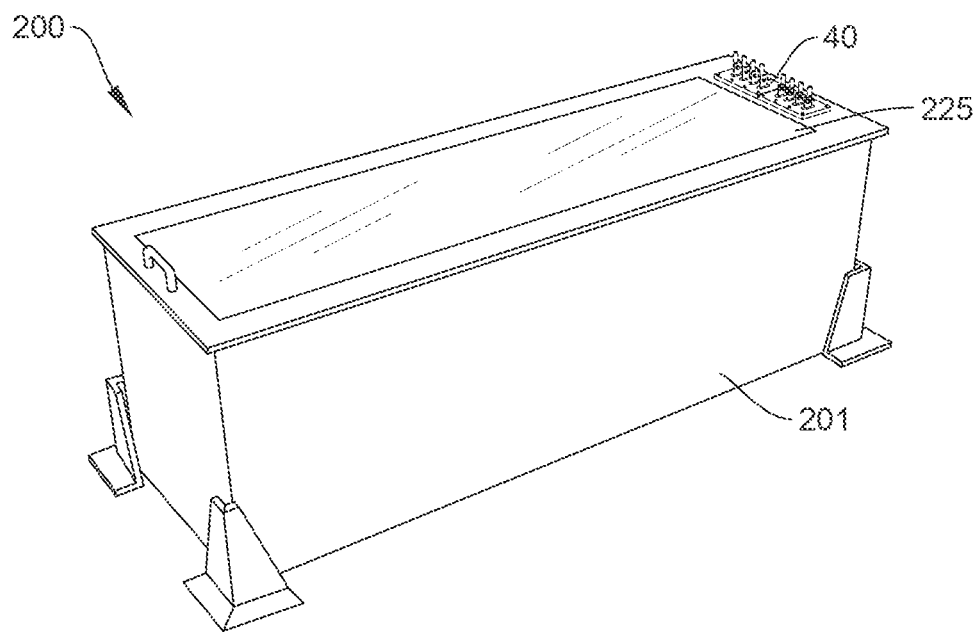
FIG. 1 shows a perspective view of an immersion cooling tank, in accordance with some embodiments of the present invention.
Figure 2:
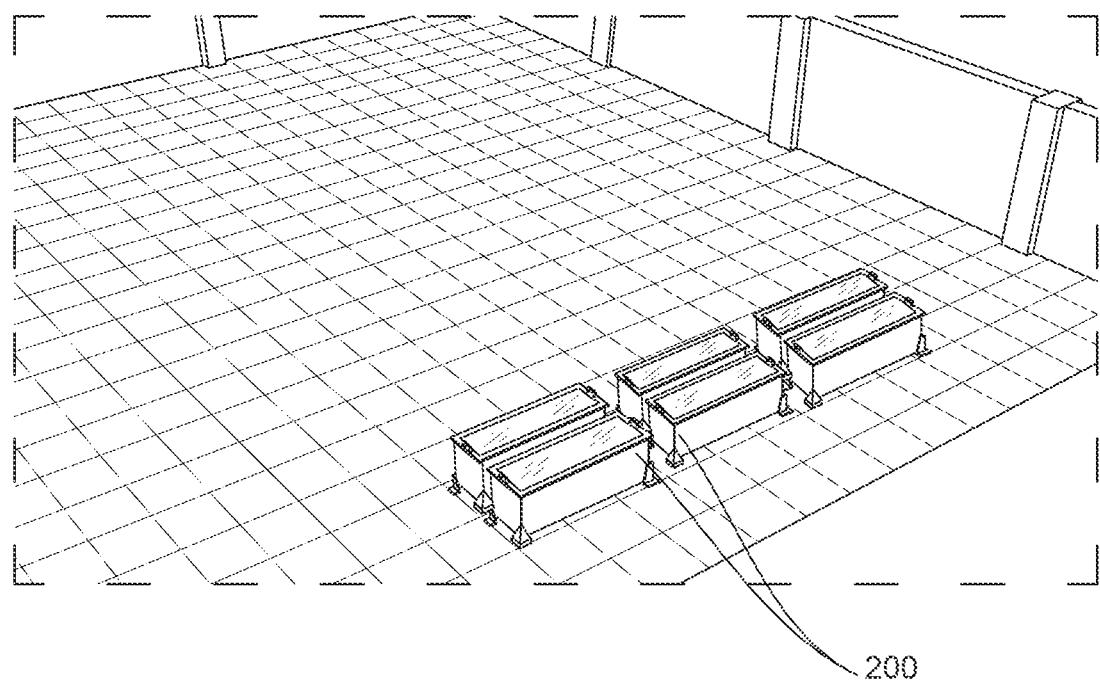
FIG. 2 shows a plurality of immersion cooling tanks arranged in a data center, in accordance with some embodiments of the present invention.

The immersion tank 201 may have an opening 220. The opening 220 may be located in a top portion of the immersion tank 201, as shown in FIG. 3. The opening 220 may provide access to an interior volume of the immersion tank 201 to facilitate insertion and removal of electronic devices 800 (e.g. servers, switches, or power electronics). The interior volume of the immersion tank 201 may be defined by a bottom surface and a plurality of side surfaces. To seal the opening 200 to prevent loss of dielectric vapor 615 into the ambient environment, the immersion tank 201 may have a lid 225, as shown in FIG. 1. When open, the lid 225 may provide access to the interior volume of the immersion tank 201. When closed, the lid 225 may enclose the opening 220 and prevent vapor loss. Although the embodiment shown in FIG. 1 shows an immersion tank 201 having a substantially rectangular shape, that is done for illustrative purposes only. The immersion tank 201 may have any shape desired that can be manufactured economically and used efficiently.

The immersion tank 201 may be partially filled with a liquid dielectric fluid 620, as shown in FIG. 6. The liquid dielectric fluid 620 may have a boiling point that is less than an operating temperature of the electronic device(s) 800 being cooled. When the electronic device(s) 800 is operating, the liquid dielectric fluid 620 in contact with the device(s) 800 may boil locally and produce a dielectric vapor 615. The dielectric vapor 615 may form vapor bubbles 616 that rise in the fluid bath and into the headspace 206 of the immersion tank 201.

The two-phase immersion cooling apparatus 200 may include a condenser (e.g., a cooling coil) 235, as shown in FIG. 3A. In some embodiments, the condenser 235 may be located in the headspace 206 of the immersion tank 201. The condenser 235 is structured and arranged to condense dielectric vapor 615 present in the headspace 206. In some applications, the condenser 235 may include a cooling coil that receives a coolant, such as chilled water, water-glycol mixture, or refrigerant, from a heat rejection system, such as an evaporative cooling tower, dry cooler, or chilled water loop. The coolant may be supplied to the condenser 235 at a temperature at or below a dew point of the vapor 615 occupying the headspace 206.

The two-phase immersion cooling apparatus 200 may include a busbar assembly 100, as shown in FIG. 3A. The busbar assembly 100 allows power to be conveniently connected and disconnected without opening the immersion tank 201 and without losing vapor 615. The busbar assembly 100 may be installed in the interior volume of the immersion tank 201. For example, the busbar assembly 100 may abut one or more interior walls of the immersion tank 201 and/or may be mounted to or rest against one or more interior surfaces of the immersion tank 201. The busbar assembly 100 may include any number of busbars 20, as shown in FIGS. 5-11. Each busbar 20 may be made of a suitable conductive material, such as, for example, copper, brass, aluminum, or steel-reinforced aluminum.

The busbar assembly 100 may include a pass-through connection assembly 40, as shown in FIG. 4A. The pass-through connection assembly 40 may include a connection block 41. The connection block 41 may be mounted to an outer surface 222 of the upper portion 205 of the immersion tank 201, as shown in FIGS. 1 and 3. The connection block 41 may be mounted over an opening 240 in a top portion of the immersion tank 201, as shown in FIG. 4A. The connection block 41 may be mounted above the liquid level 206. The connection block 41 may be made of a chemically resistant material (e.g., a phenolic, a mylar, a polyimide, an epoxy, any other dielectric material compatible with the dielectric fluid 620, and combinations thereof).

The connection block 41 may include a plurality of electrical connectors 45 that are structured and arranged to extend through the connection block 41 and the opening 240 and to electrically connect to a corresponding busbar 20 in the immersion tank 201. The electrical connector 45 can be, for example, a busbar portion, an electrical connection pin, or an electrical cable. Each electrical connector 45 may be configured to electrically connect an external power source to one of the plurality of busbars 20. As an example, the electrical connector 45 may include a terminal lug 48 that allows electrical power from a power outlet or power source to be supplied to the busbar 20.

During operation, waste heat generated by the electronic device (s) 800 is transferred from the electronic device(s) 800 to the liquid dielectric fluid 620 and a portion of liquid dielectric fluid 620 may heat, boil, and vaporize to form the dielectric vapor 615. The dielectric vapor 615 may rise through the dielectric liquid 620 into the headspace 206 of the immersion tank 201. To prevent loss of vapor 615 from the headspace 206, the pass-through connection assembly 40 may provide a fluid-tight seal against an exterior surface 222 and above the liquid level 206.

The pass-through connection assembly 40 may include a seal (e.g., a sealing device, such as a gasket, an O-ring, and the like) 42 between a bottom surface of the connection block 41 and an outer surface 222 of the immersion tank 201, as shown in FIG. 4B. The seal 42 may be disposed in a groove 47 on the bottom surface of the connection block 41. The pass-through connection assembly 40 may include a plurality of fasteners 43. The fasteners 43 may be tightened to compress the seal 42 and provide a vapor-tight seal around the opening 240. In the example shown in FIG. 4A, a plurality of studs 46 may protrude from the outer surface 222 near the opening 240, and the fasteners 43 may be threaded into the studs 46 to secure the connection block 41 to the outer surface 222.

A bottom portion of the busbar assembly 100 may include an (e.g., chemically resistant) insulator block 10, as shown in FIG. 5. The insulator block 10 may extend horizontally from a first end 16 to a second end 17. The insulator block 10 may be made of a materially that is chemically stable in the presence of a liquid dielectric fluid, such as hydrofluoroether and/or may be made of an electrically insulating material, such as phenolic material. In some embodiments, the insulator block 10 may be made of one or more of a phenolic, a mylar, a polyimide, an epoxy, or other dielectric material compatible with the liquid dielectric fluid 620.

As shown in FIG. 3A, the insulator block 10 may include a base portion 14 that is positioned against a bottom interior surface of the immersion tank 201. The insulator block 10 may also include an upright portion 15 that is positioned against an interior side wall of the immersion tank 201.

Together, the base portion 14 and upright portion 15 may form an L-shaped insulator block 10 that is structured and arranged to fit within the immersion tank 201. The upright portion 15 may extend from the base portion 14 to the pass-through connection assembly 40 located in the upper portion 205 of the tank assembly 201.

The insulator block 10 may include a plurality of barriers 12, as shown in FIGS. 3A, 5 and 6. The barriers 12 may extend (e.g., longitudinally) from the first end 16 to the second end 17 of the insulator block. As shown in FIGS. 3A, 5 and 6, adjacent pairs of barriers 12a, 12b form a corresponding channel 13 therebetween. The channels 13 may also extend (e.g., longitudinally) from the first end 16 to the second end 17 of the insulator block 10. As shown in FIG. 3A, the barriers 12 and channels 13 may extend along the base portion 14 of the insulator block 10. The barriers 12 and channels 13 may also extend along the upright portion 15 of the insulator block 10. Together, a base channel 33 in the base portion 14 and a corresponding upright channel 19 in the upright portion 15 may align and provide a continuous L-shaped channel configured to receive an L-shaped busbar 20.

FIG. 3A shows an L-shaped busbar 20 disposed in an L-shaped channel. Once installed, the top surfaces 29 of the conductive busbars 20 are recessed below the top surfaces 18 of the barriers 12, thereby preventing accidental electrocution. Recessing the busbar 20 below the top surfaces 18 of the barriers 12 may also protect the busbar 20 from physical damage and reduce risk of short-circuiting.

As shown in FIG. 3B, the L-shaped busbar 20 may include a base section 24 and an upright section 25. In some variations, the base section 24 may be joined to the upright section 25 by, for example, a plate connector 22 and fasteners 23. In another example, the base section 24 and the upright section 25 may be a unitary piece. Once installed, the upright section 25 of the busbar 20 may extend from the pass-through connection assembly 40 to the base portion 14 of the insulator block 10. The busbar 20 may conduct current from the pass-through connection assembly 40 to one or more electronic devices 800 disposed within the immersion tank 201.

Referring to FIGS. 5 and 6, a top surface 29 of the base section 24 of the L-shaped busbar 20 may be recessed below a top surface 18 of the barrier 12 by a distance ($d_{recess}$). Recessing the busbar 20 below the top surface 18 may protect the busbar 20 and prevent accidental electrocution. For example, the top surface 18 may prevent a misplaced hand tool or electronic device chassis from accidentally contacting and short-circuiting the busbar 20. The top surfaces 18 of the barriers 12 also may support the electronic devices 800 and alleviate physical load from the busbars 20. For example, an electronic device 800 installed in the immersion tank 201 may rest against one or more top surfaces 18 and include an electrical connection that extends downward into the channel 13 and electrically connects to the base section 24 of the busbar 20.

In the example shown in FIG. 6, the busbar 20 may be disposed in a slot 35 formed in the bottom of the channel 13. The slot 35 may support and retain the busbar 20 in an upright orientation. An effective busbar height ($h_{busbar}$) may be measured upward from a bottom surface of the channel 13. The effective busbar height ($h_{busbar}$) may be less than the barrier height ($h_{barrier}$). Dimensions of the barriers 12, channels 13, and busbars 20 may be selected to increase creepage and increase clearance. A creepage distance may be defined as the shortest path between two busbars 20, measured along an outer surface of the insulator block 10. A clearance distance may be defined as the shortest path between two busbars 20, measured through air or liquid.

A first clearance gap 30 may be provided between the busbar 20 and a first adjacent barrier 12a. A second clearance gap 31 may be provided between the busbar 20 and a second adjacent barrier 12b. During two-phase cooling, the clearance gaps 30, 31 may allow vapor bubbles 616 to escape from the channel 13, as shown in FIG. 6, and allow subcooled liquid 620 to flow back into the channel 13. This continuous circulation of subcooled fluid 620 into the channel 13 may ensure effective heat dissipation from the busbar 20 and prevent dry-out on surfaces of the busbar 20.

The first clearance gap 30 and the second clearance gap 31 may be approximately equal in size, resulting in the busbar 20 being substantially centered in the channel 13. The first clearance gap 30 may be greater (e.g., at least two times greater) than a busbar 20 width ($w_{busbar}$). The second clearance gap 31 ($w_{gap}$) may be greater (e.g., at least two times greater) than the busbar width.

The first barrier 12a may have a width ($w_{barrier}$) greater (e.g., at least two times greater) than a width of the channel 13 ($w_{channel}$). The second barrier 12b may have a width greater (e.g., at least two times greater) than the channel width ($w_{channel}$).

The top surface 29 of the busbar 20 may be recessed below the first top surface 18a and/or may be recessed below the second top surface 18b. In some implementations, the top surface 29 of the busbar 20 may be recessed below both the first top surface 18a and the second top surface 18b at a distance that is at least equal to the width of the busbar. For example, the top surface 29 of the busbar 20 may be recessed below both the first top surface 18a and the second top surface 18b a distance at least equal to the width of the first clearance gap 30 or the second clearance gap 31.

The busbar assembly 100 may include one or more busbars 20. In one embodiment, the busbar assembly 100 may include any number of busbars 20 (e.g., a first busbar (L1), a second busbar (L2), and a third busbar (L3)) to support three-phase power transmission. The busbar assembly 100 may also include a protective earth busbar (PE) and/or a neutral busbar (N).

Figure 7:
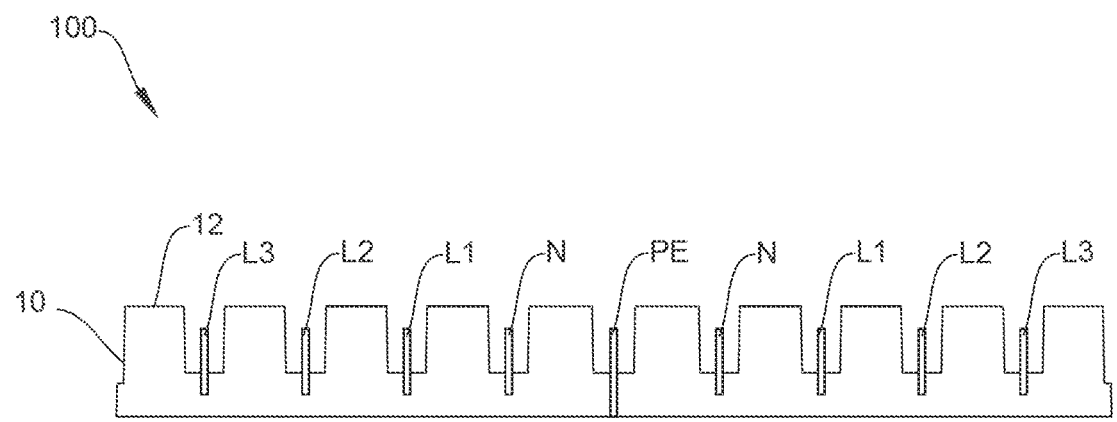
FIG. 7 shows a front view of an exemplary three-phase busbar assembly, in accordance with some embodiments of the present invention.

In some embodiments, the busbars 20 may be arranged in a symmetrical configuration, as shown in FIGS. 7-11, so electronic devices 800 can be attached in either of two orientations while allowing respective connectors of the electronic device 800 to connect to intended busbars 20. FIG. 7 shows a symmetrical arrangement of busbars for a three-phase application that allows an electronic device 800 to be attached in either of two orientations while allowing respective connectors of the device 800 to connect to intended busbars 20. While symmetrical arrangements of busbars 20 are shown and described, it is also possible to use one or more non-symmetrical arrangements of busbars 20.

Figure 8:
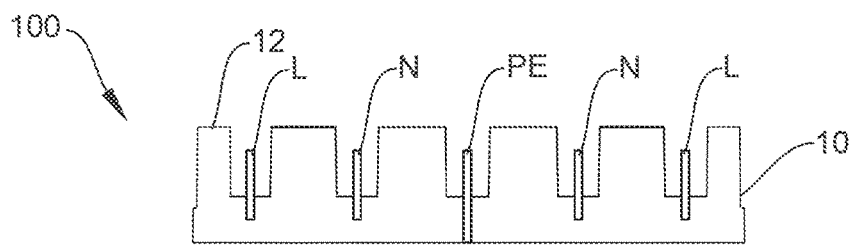
FIG. 8 shows a front view of an exemplary single-phase busbar assembly having a single protective earth busbar, in accordance with some embodiments of the present invention.
Figure 9:
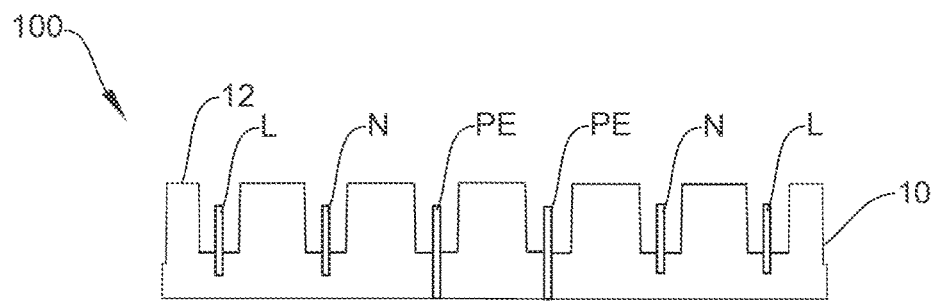
FIG. 9 shows a front view of an exemplary single-phase busbar assembly having a pair of protective earth busbars, in accordance with some embodiments of the present invention.
Figure 10:
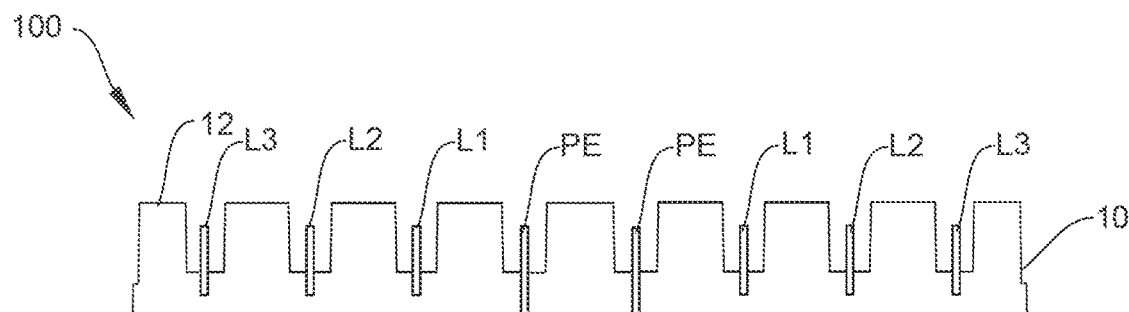
FIG. 10 shows a front view of a an exemplary three-phase busbar assembly having no neutral busbars, in accordance with some embodiments of the present invention.
Figure 11:
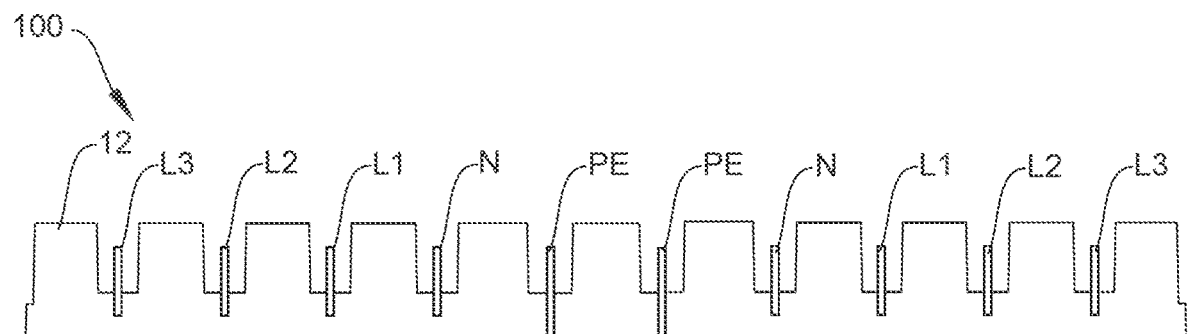
FIG. 11 shows a front view of a an exemplary three-phase busbar assembly having a pair of neutral busbars, in accordance with some embodiments of the present invention.

More specifically, FIG. 7 shows a symmetrical implementation of a busbar assembly 100 supporting a pair of three-phase voltage busbars (L1, L2, L3) with a pair of neutral busbars (N) and a protective earth busbar (PE). FIG. 8 shows a symmetrical implementation of a busbar assembly 100 supporting a pair of single-phase voltage busbars (L) with a pair of neutral busbar (N) and a single protective earth busbar (PE). FIG. 9 shows a symmetrical implementation of a busbar assembly 100 supporting a pair of single-phase voltage busbars (L) with a pair of neutral busbars (N) and a pair of protective earth busbars (PE). FIG. 10 shows a symmetrical implementation of a busbar assembly 100 supporting a pair of three-phase voltage busbars (L1, L2, L3) without a neutral busbar but with a pair of protective earth busbars (PE). FIG. 11 shows a symmetrical implementation of a busbar assembly 100 supporting a pair of three-phase voltage busbars (L1, L2, L3) with a pair of neutral busbars (N) and also a pair of protective earth busbars (PE).

In some embodiments, the busbar assembly 20 may be a kit of components that can be installed on an existing immersion tank 201. The kit may include the insulator block 10, one or more busbars 20, and the pass-through connection assembly 40.

As used herein, the term "fluid" may refer to a substance in gas form, liquid form, or a two-phase mixture of gas and liquid. The fluid may be capable of undergoing a phase change from liquid to vapor or vice versa. The liquid may form a free surface that is not created by a container in which it resides, while the gas may not.

As used herein, the term "vapor" may refer to a substance in a gas phase at a temperature lower than the substance's critical temperature. Therefore, the vapor may be condensed to a liquid by increasing pressure without reducing temperature.

As used herein, the term "two-phase" may refer to a vapor phase of a substance coexisting with a liquid phase of the substance. When this occurs, a gas partial pressure may be equal to a vapor pressure of the liquid.

As used herein, "target liquid level" may refer to a desired fluid level in an immersion tank. In one example, the target liquid level may be marked on an interior side wall of the immersion tank. Prior to use, the immersion tank may be filled with dielectric fluid up to the target liquid level.

A liquid dielectric fluid 620, such as a hydrofluorocarbon (HFC) or a hydrofluoroether (HFE), can be used as the fluid in the immersion cooling apparatus 200. Unlike water, dielectric fluids can be used in direct contact with electronic devices 800, such as microprocessors 801, memory modules, and power inverters, without risk of shorting electrical connections. Non-limiting examples of liquid dielectric fluids include 1,1,1,3,3-pentafluoropropane (known as R-245fa), hydrofluoroether (HFE), 1-methoxyheptafluoropropane (known as HFE-7000), methoxy-nonafluorobutane (known as HFE-7100). Hydrofluroethers, including HFE-7000, HFE-7100, HFE-7200, HFE-7300, HFE-7500, and HFE-7600, are commercially available as NOVEC Engineered Fluids from 3M Company headquartered in Mapleton, Minn. FC-40, FC-43, FC-72, FC-84, FC-770, FC-3283, and FC-3284 are commercially available as FLUOROINERT Electronic Liquids also from 3M Company.

The elements and method steps described herein can be used in any combination whether explicitly described or not. All combinations of method steps as described herein can be performed in any order, unless otherwise specified or clearly implied to the contrary by the context in which the referenced combination is made.

As used herein, the singular forms "a," "an," and "the" include plural referents unless the content clearly dictates otherwise.

The methods and compositions of the present invention can comprise, consist of, or consist essentially of the essential elements and limitations described herein, as well as any additional or optional steps, components, or limitations described herein or otherwise useful in the art.

It is understood that the invention is not confined to the particular construction and arrangement of parts herein illustrated and described, but embraces such modified forms thereof as come within the scope of the claims.

The foregoing description has been presented for purposes of illustration and description. It is not intended to be exhaustive or to limit the claims to the embodiments disclosed. Other modifications and variations may be possible in view of the above teachings. The embodiments were chosen and described to explain the principles of the invention and its practical application to enable others skilled in the art to best utilize the invention in various embodiments and various modifications as are suited to the particular use contemplated. It is intended that the claims be construed to include other alternative embodiments of the invention except insofar as limited by the prior art.

What is claimed is:

1. A busbar assembly for an immersion cooling apparatus, the busbar assembly comprising:
    an insulator block, having a first end and a second end opposite the first end, and comprising:
        a first barrier extending from the first end to the second end, the first barrier comprising a first support surface and a first barrier width;
        a second barrier extending from the first end to the second end, the second barrier comprising a second support surface and a second barrier width; and
        a channel between the first barrier and the second barrier, the channel extending from the first end to the second end and having a channel width;
    a slot formed in a bottom surface of the channel; and
    a busbar disposable in the slot, the busbar having a top surface that is recessed below the first support surface and the second support surface.

2. The busbar assembly of claim 1, wherein the busbar is substantially centered in the channel.

3. The busbar assembly of claim 1, wherein a first clearance gap is formed between the busbar and the first barrier, a second clearance gap is formed between the busbar and the second barrier, and the busbar has a busbar width, wherein at least one of the first clearance gap is greater than the busbar width or the second clearance gap is greater than the busbar width.

4. The busbar assembly of claim 1, wherein a first clearance gap is formed between the busbar and the first barrier, a second clearance gap is formed between the busbar and the second barrier, and the top surface of the busbar is recessed below the first support surface and the second support surface a distance that is greater than at least one of the first clearance gap or the second clearance gap.

5. The busbar assembly of claim 1, wherein the insulator block comprises one or more dielectric materials selected from a group consisting of a phenolic material, a mylar material, a polyimide material, and an epoxy material.

6. The busbar assembly of claim 1, wherein the channel is one of a plurality of channels formed in the insulator block, the plurality of channels arranged in a parallel configuration, wherein the busbar is one of a plurality of busbars, each channel of the plurality of channels containing one of the plurality of busbars.

7. The busbar assembly of claim 6, wherein the plurality of busbars is adapted to transmit single-phase power or three-phase electrical power.

8. The busbar assembly of claim 6, wherein the plurality of busbars comprises a first set of busbars configured to transmit three-phase electrical power and a second set of busbars configured to transmit three-phase electrical power, wherein the first set of busbars and the second set of busbars are arranged in a symmetrical configuration to allow an electrical device to be electrically connected to the plurality of busbars in at least one of a first orientation or a second orientation.

9. An immersion cooling apparatus comprising:
an immersion tank, having an upper portion and a lower portion and defining a target liquid level therebetween, and comprising an interior volume defined by a bottom portion and a plurality of side walls; and
a busbar assembly positioned within the interior volume of the immersion tank, the busbar assembly comprising:
an insulator block comprising a base portion and an upright portion, the base portion adjacent to an interior surface of the bottom portion, the upright portion adjacent to an interior surface of a side wall of the plurality of side walls;
a base channel extending from a first end of the base portion to a second end of the base portion;
an upright channel extending from a first end of the upright portion to a second end of the upright portion;
a first barrier extending along the base channel, the first barrier having a first support surface and a first barrier width;
a second barrier extending along the base channel, the second barrier having a second support surface and a second barrier width; and
a busbar comprising a base section electrically connected to an upright section, the base section disposed in the base channel, and the upright section disposed in the upright channel,
wherein a top surface of the base section is positionable below at least one of the first support surface or the second support surface.

10. The immersion cooling apparatus of claim 9, further comprising a pass-through connection assembly comprising:
a connection block mountable to an external surface of the immersion tank above the target liquid level;
an electrical connector extending through the connection block; and
a seal configured to provide a fluid-tight seal between a bottom surface of the connection block and an outer surface of the immersion tank,
wherein the upright section of the busbar is adapted to pass through an opening in the immersion tank and to electrically connect to the electrical connector.

11. The immersion cooling apparatus of claim 9, wherein the base channel and the upright channel form an L-shaped channel, and wherein the base section and the upright section form an L-shaped busbar that is disposable within the L-shaped channel.

12. The immersion cooling apparatus of claim 9, further comprising:
a base slot in the base channel, wherein the base section of the busbar is positionable in the base slot; and
an upright slot in the base channel, wherein the upright section of the busbar is positionable in the base slot.

13. The immersion cooling apparatus of claim 9, further comprising a condenser located within the interior volume of the immersion tank and above the target liquid level.

14. A busbar assembly kit for an immersion cooling tank, the busbar assembly kit comprising:
an insulator block comprising:
a base portion and an upright portion that are adapted to form an L-shaped insulator block;
a base channel extending from a first end of the base portion to a second end of the base portion;
an upright channel extending from a first end of the upright portion to a second end of the upright portion, the upright channel and the base channel together structured and arranged to form an L-shaped channel;
a first barrier extending along the base channel, the first barrier having a first support surface; and
a second barrier extending along the base channel, the second barrier having a second support surface; and
an L-shaped busbar comprising a base section and an upright section,
wherein the base channel is configured to receive the base section and the upright channel is configured to receive the upright section, and
wherein the base section is recessed below at least one of the first support surface and the second support surface when the base section is disposed in the base channel.

15. The busbar assembly kit of claim 14, further comprising a pass-through connection assembly comprising:
a connection block;
an electrical connector extending through the connection block and configured to connect to the upright section of the L-shaped busbar; and
a seal configured to provide a fluid-tight seal between a bottom surface of the connection block and an outer surface of an immersion tank.

16. The busbar assembly kit of claim 15, further comprising a groove formed in the bottom surface of the connection block, wherein the seal is disposable in the groove.

17. The busbar assembly kit of claim 14, further comprising a base slot in the base channel, the base slot configured to receive the base section of the L-shaped busbar.

18. The busbar assembly kit of claim 14, further comprising an upright slot in the upright channel, the upright slot configured to receive the upright section of the L-shaped busbar.

19. The busbar assembly kit of claim 14, further comprising a plate connector that is structured and arranged to join the base section of the L-shaped busbar to the upright section of the L-shaped busbar.

20. The busbar assembly kit of claim 14, the insulator block further comprising:
a third barrier extending along the upright channel, the third barrier having a third support surface; and
a fourth barrier extending along the upright channel, the fourth barrier having a fourth support surface,
wherein the upright section is recessed below the third support surface and the fourth support surface when the upright section is installed in the upright channel.

* * * * *